United States Patent [19]

Ohki et al.

[11] Patent Number: 5,569,616
[45] Date of Patent: Oct. 29, 1996

[54] PROCESS FOR FORMING AN OUTPUT CIRCUIT DEVICE FOR A CHARGE TRANSFER ELEMENT HAVING TRIPARTITE DIFFUSION LAYER

[75] Inventors: Hiroaki Ohki, Tokyo; Osamu Nishima; Hiroyuki Mori, both of Kanagawa; Junya Suzuki, Kanagawa, all of Japan

[73] Assignee: Sony Corporation, Tokyo, Japan

[21] Appl. No.: 446,251

[22] Filed: May 22, 1995

Related U.S. Application Data

[62] Division of Ser. No. 180,283, Jan. 12, 1994, Pat. No. 5,432,364.

[30] Foreign Application Priority Data

Jan. 12, 1993 [JP] Japan ................................ 5-020549
Mar. 31, 1993 [JP] Japan ................................ 5-098722

[51] Int. Cl.$^6$ .......................... H01L 21/265; H01L 21/22
[52] U.S. Cl. ...................... 437/44; 437/41; 437/154
[58] Field of Search ............................. 437/50, 53, 44, 437/152, 154, 933, 40 DM, 41 DM, 41 RLD

[56] References Cited

U.S. PATENT DOCUMENTS

| | | | |
|---|---|---|---|
| 4,011,471 | 8/1977 | Rockett, Jr. | |
| 4,935,379 | 6/1990 | Toyoshima | 437/44 |
| 4,962,052 | 10/1990 | Asayama et al. | |
| 4,970,173 | 11/1990 | Robb | 437/40 |
| 5,015,598 | 5/1991 | Verhaar | |
| 5,192,990 | 3/1993 | Stevens | |
| 5,194,929 | 3/1993 | Ohshima et al. | 257/326 |
| 5,276,346 | 1/1994 | Iwai et al. | |
| 5,293,057 | 3/1994 | Ho et al. | 257/356 |
| 5,309,005 | 5/1994 | Nagakawa et al. | |
| 5,341,011 | 8/1994 | Hshieh et al. | |
| 5,389,558 | 2/1995 | Suwani et al. | 437/44 |

FOREIGN PATENT DOCUMENTS

| | | |
|---|---|---|
| 0108204 | 5/1984 | European Pat. Off. |
| 54-103672 | 8/1979 | Japan |
| 62-021213 | 1/1987 | Japan |
| 63-024668 | 2/1988 | Japan |
| 63-250859 | 10/1988 | Japan |
| 4206742 | 7/1992 | Japan |
| 2247779 | 3/1992 | United Kingdom |
| 8801286 | 3/1988 | WIPO |

Primary Examiner—John Niebling
Assistant Examiner—Brian K. Dutton
Attorney, Agent, or Firm—Hill, Steadman & Simpson

[57] ABSTRACT

An output circuit device for detecting and converting signal charge transferred thereto from a charge transfer section of a CCD into a signal voltage and a method of forming same. A first diffusion region is formed by diffusing into the semiconductor body a low concentration of an impurity having a conduction type opposite to that of said semiconductor body and having a high diffusion coefficient. A second diffusion region is formed by diffusing into an upper surface portion of the first diffusion region, and in self-alignment therewith, a high concentration of an impurity having a low diffusion coefficient. A third diffusion region is formed by diffusing into the first and second diffusion regions, and in self-alignment therewith, a high concentration of an impurity having a high diffusion coefficient, such that the third diffusion region extends from a surface of said semiconductor body through said first and second diffusion regions to beneath the first diffusion region. A wiring line is formed on the semiconductor body such that the first, second and third diffusion regions lie beneath the wiring line. The high and low diffusion coefficients are high and low relative to one another, and the high and low concentrations are high and low relative to one another.

14 Claims, 7 Drawing Sheets

PROCESS FOR FORMING AN OUTPUT CIRCUIT DEVICE FOR A CHARGE TRANSFER ELEMENT HAVING TRIPARTITE DIFFUSION LAYER

This is a division of application Ser. No. 08/180,283 filed Jan. 12, 1994, now U.S. Pat. No. 5,432,364.

BACKGROUND OF THE INVENTION

1. Field of the Invention

This invention relates to an output circuit device which detects signal charge transferred thereto from a charge transfer section of a charge transfer element such as a solid-state imaging element and converts the signal charge into a signal voltage.

2. Description of the Related Art

One of important characteristics required for recent CCD (charge coupled device) solid-state imaging elements is the conversion capacity for converting low signal charge into a signal voltage together with the structure of a sensor section in order to prevent possible deterioration of the sensitivity at a low illuminance when the imaging element is formed in a reduced size.

In order to raise the voltage conversion capacity of signal charge, the parasitic capacitance of the charge detection section must necessarily be reduced as low as possible. In order to reduce the parasitic capacitance, the capacitance between the gate and the channel of a MOS transistor which receives signal charge first should be reduced, that is, the area of the gate should be reduced.

However, if the area of the gate of a MOS transistor is reduced, then the 1/f noise which relies upon the area of the gate of a MOS transistor constituting an output circuit is increased.

Consequently, the picture quality at a low illuminance is deteriorated, which makes an obstacle to maintenance or enhancement, of the signal to noise ratio at a level of conventional products when it is tried to minimize CCD solid-state imaging elements.

Figure 10:
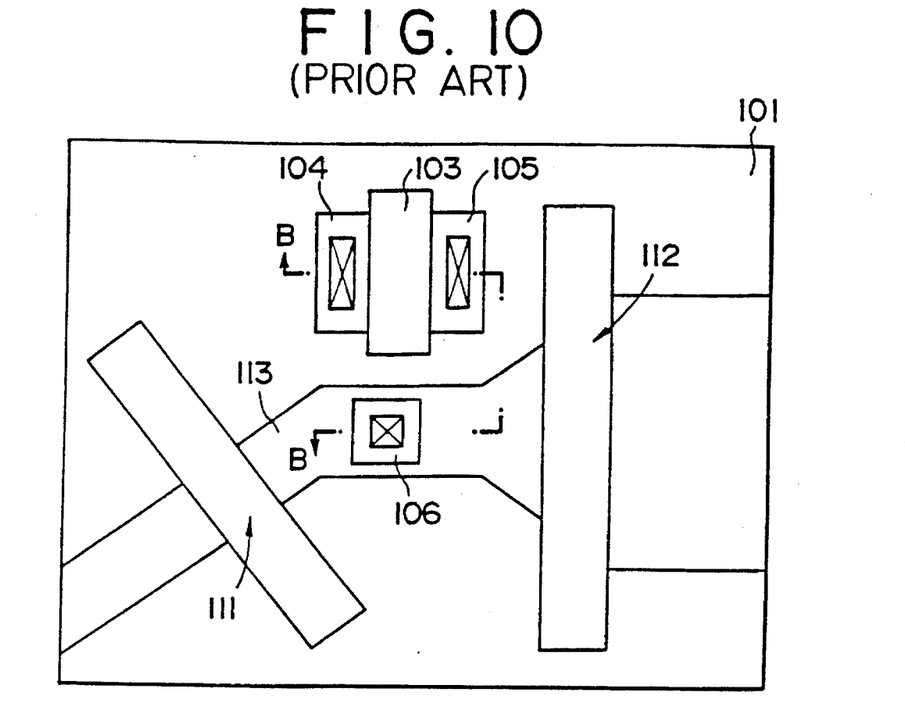
FIG. 10 is a schematic plan view of a conventional output circuit device for a charge transfer element.
Figure 11:
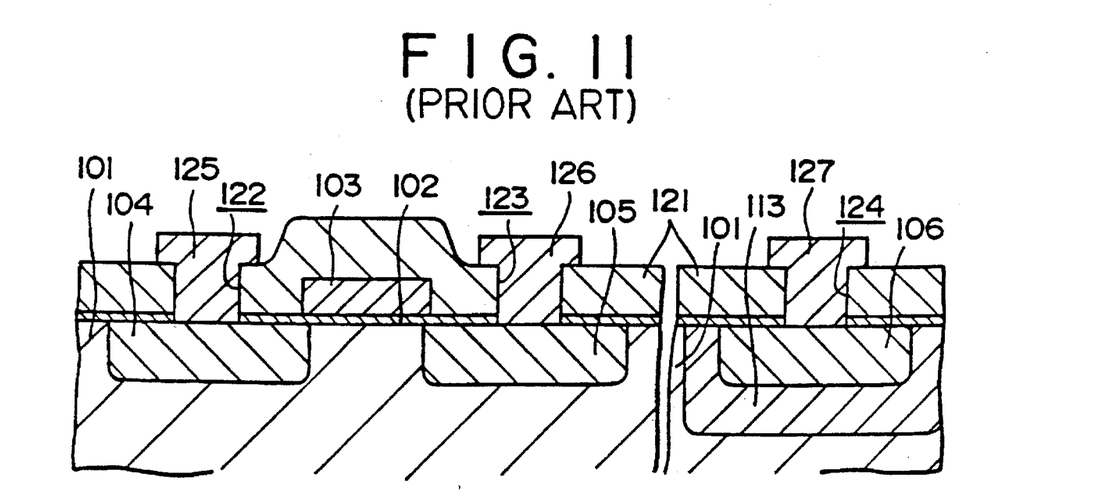
FIG. 11 is a sectional view taken along line B—B of FIG. 10.

An output circuit section of a CCD imaging element is shown in FIGS. 10 and 11. Referring to FIGS. 10 and 11, a gate electrode 103 is formed on the surface of a semiconductor body 101 with a gate insulation film 102 interposed therebetween. A pair of source-drain regions 104 and 105 are formed on the upper face of the semiconductor body 101 on the opposite sides of the gate electrode 103.

A high concentration diffusion layer 106 is formed at a location on a low concentration diffusion layer 113 of a reset transistor 111, a horizontal output transistor 112 and so forth provided on the upper face of the semiconductor body 101 to which a wiring line 127, which will be hereinafter described, is connected. The high concentration diffusion layer 106 exhibits a floating condition with respect to the semiconductor body 101.

An interlayer insulating layer 121 is formed on the semiconductor body 101. The interlayer insulation film 121 has contact holes 122, 123 and 124 formed therein above the source-drain regions 104 and 105 and the high concentration diffusion layer 106, respectively. A wiring line 125 extends through the contact hole 122 and is connected to the source-drain region 104, and another wiring line 126 extends through the contact hole 123 and is connected to the source-drain region 105. A further wiring line 127 extends through the contact hole 124 and is connected to the high concentration diffusion layer 106.

The source-drain regions 104 and 105 and the high concentration diffusion layer 106 are formed by diffusion of arsenic. Phosphorous or a like element in a high concentration.

Where, for example, arsenic is diffused in a high concentration to form the source-drain regions 104 and 105 and the high concentration diffusion layer 106, the depth of the junction is small since the diffusion coefficient of arsenic is low.

Thus, since the depth of the junction is small with an output circuit section wherein a high concentration diffusion layer (hereinafter referred to as diffusion layer) such as the layer of the source-drain regions or the high concentration diffusion layer is formed by diffusion of arsenic in a high concentration, where an aluminum spike is produced at a junction between the diffusion layer and a wiring line, the aluminum spike penetrates through the diffusion layer to cause a junction leak. As a result, the reliability of the element is deteriorated significantly.

Further, in a CCD element of the aluminum shunt structure wherein a wiring line serves also as a light interception film, if an aluminum-silicon alloy is employed as a material for a wiring line in order to suppress production of an aluminum spike, then silicon is deposited in the inside of the aluminum-silicon alloy so that the wiring line becomes inclined to transmit light therethrough. Light having transmitted through the wiring line is admitted into the transfer electrode, resulting in deterioration of the smear characteristic. This makes a fatal defect to the CCD element. Consequently, the reliability of the CCD element is reduced significantly.

On the other hand, where phosphorous is diffused in a high concentration to form a diffusion layer, since the phosphorous is introduced to a very deep location of the semiconductor body, the diffusion layer is formed deep. Consequently, the subject of a junction leak arising from an aluminum spike is solved. However, since phosphorous has a higher diffusion coefficient than arsenic, the diffusion layer is formed over a wide area also in radial directions in the semiconductor body. Consequently, in a MOS transistor, the diffusion layer exhibits s greater overlapping area with a gate electrode. As a result, the gate electrode is present on the n-type diffusion layer of s high concentration, and consequently, a depletion layer is not extended toward the semiconductor body. Consequently, the capacitance per unit area of the portion is increased, which significantly deteriorates the efficiency in conversion of charge into a voltage.

In this manner, where the depth of a diffusion layer is small, the subject of an aluminum spike is involved, but Where the depth of a diffusion layer is great, the subject of an increase of the capacitance is involved.

Further, where the concentration of a diffusion layer is reduced, the contact resistance between a wiring line and the diffusion layer is increased, which leads to the subject that the driving capacity of the output circuit section is reduced.

SUMMARY OF THE INVENTION

It is an object of the present invention to provide an output circuit device for a charge transfer element which reduces the 1/f noise while maintaining the voltage conversion capacity of low signal charge at a high level to achieve enhancement of the picture quality and the sensitivity characteristic at a low illuminance.

It is another object of the present invention to provide an output circuit device for a charge transfer element which eliminates a junction leak and has a junction of high reliability.

In accordance with an aspect of the present invention, there is provided an output circuit device for a charge transfer element, which comprises a region for accumulating signal charge transferred thereto from a charge transfer section of the charge transfer element, and converting means for converting the signal charge into a voltage, the converting means including a first MOS transistor which receives the signal charge and a second MOS transistor, the first MOS transistor having a first gate insulating layer which has a thickness smaller than that of a second gate insulating layer of the second MOS transistor.

Preferably, the first insulating layer has a thickness ranging from two thirds to one third of that of the second insulating layer.

With the output circuit device for a charge transfer element, since the gate oxide film of the first MOS transistor which receives signal charge is formed as a thinner film than the gate oxide films of the other MOS transistors in the same circuit, the 1/f noise can be reduced because the 1/f noise which is produced from the output circuit device increases in proportion to the square of the thickness of the gate oxide film of the MOS transistor, and consequently, while the voltage conversion capacity of low signal charge can be maintained at a high level by reducing the area of the gate of the MOS transistor, the picture quality and the sensitivity characteristic at a low illuminance can be enhanced by reduction of the 1/n noise.

In accordance with another aspect of the present invention, there is provided an output circuit device for a charge transfer element, which comprises a wiring line layer formed on a semiconductor body, and a diffusion layer connected to the wiring line layer and having impurities of a conduction type opposite to that of the semiconductor body diffused in the semiconductor body, the diffusion layer including a first diffusion layer formed by diffusing an impurity having a high diffusion coefficient in a low concentration into the semiconductor body, a second diffusion layer formed by diffusing another impurity having a low diffusion coefficient in a high concentration into a portion of an upper face of the first diffusion layer, and a third diffusion layer formed by diffusing the impurity having the high diffusion coefficient in a high concentration into the range of the second diffusion layer deeper than the first diffusion layer.

In particular, according to the junction structure, a diffusion layer formed on a semiconductor body and a wiring line are connected to each other, and a first diffusion layer in which an impurity having a high diffusion coefficient such as phosphorous is diffused in a low concentration is formed on the semiconductor body. A second diffusion layer in which another impurity having a low diffusion coefficient such as arsenic or antimony is diffused in a high concentration is formed at a portion of the upper face of the first diffusion layer. Further, a third diffusion layer in which the impurity having the high diffusion concentration such as phosphorous is formed in the range of the second diffusion layer on the surface of the semiconductor body in a deeper condition than the first diffusion layer.

The diffusion layer has a source-drain region of a MOS transistor. Or, the diffusion layer has a source-drain region of an output transistor of an output circuit of a solid-state imaging apparatus. Or else, the diffusion layer has a floating diffusion region of such output circuit.

With the output circuit device for a charge transfer element, since the first diffusion layer in which phosphorous of a low concentration is diffused is formed, the capacitance of the diffusion layer can be suppressed and the reliability regarding hot carriers can be enhanced.

Further, since the second diffusion layer in which arsenic or antimony of a high concentration is diffused is formed on the upper face of the first diffusion layer, the contact resistance with a wiring line can be reduced and the driving capacity of the output circuit device can be achieved.

Further, since the third diffusion layer in which phosphorous of a high concentration is diffused in a deeper condition than the first diffusion layer, production of a junction leak caused by an aluminum spike where the wiring line is formed from an alloy containing aluminum is eliminated and the reliability of the junction can be enhanced.

According to a further aspect of the present invention, there is provided a process of manufacturing an output circuit device for a charge transfer element, which comprises steps of diffusing, into a semiconductor body, an impurity having a conduction type opposite to that of the semiconductor body and having a high diffusion coefficient, and forming a second diffusion layer having a low diffusion coefficient in a higher concentration than that of the first diffusion layer and diffusing the impurity having the high diffusion coefficient in a high concentration deeper than the first diffusion layer within the range of the second diffusion layer into the semiconductor body to form a third diffusion layer of a higher concentration than that of the first diffusion layer.

With the manufacturing process, since the first, second and third diffusion layers having different concentrations are formed making use of the difference between diffusion coefficients of impurities to be introduced into the semiconductor body, the diffusion layer which does not include a diffusion layer of a high concentration can be formed below the gate electrode of a MOS transistor. Consequently, the capacitance per unit area is not increased at all, and the efficiency of the MOS transistor in conversion of signal charge into a voltage is not deteriorated.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENTS

Figure 1:
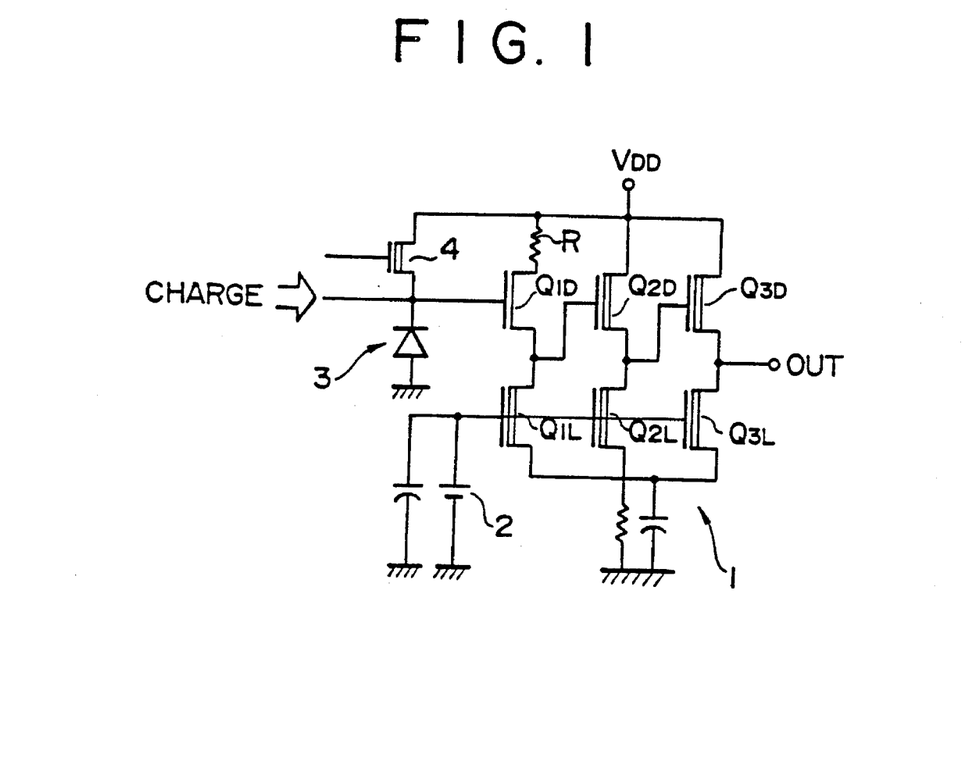
FIG. 1 is a circuit diagram of an output circuit device for a charge transfer element showing a first preferred embodiment of the present invention.

FIG. 1 shows an output circuit device for a CCD solid-state imaging element to which the present invention is applied. The output circuit device includes a signal detection section for a charge transfer element, that is, for the CCD solid-state imaging element, which in turn includes a floating diffusion amplifier and source followers in each of which a load MOS transistor is employed as load means.

In particular, referring to FIG. 1, the output circuit device shown includes an amplification section constituted from, for example, a three stage source follower circuit 1 wherein each stage includes a driving side MOS transistor $Q_{nD}$ and a load side MOS transistor $Q_{nL}$.

In the three stage source follower circuit 1, the gates of the load side MOS transistors $Q_{1L}$, $Q_{2L}$ and $Q_{3L}$ are biased commonly by a dc power source 2, and the gate of the driving side MOS transistor $Q_{1D}$ at the first stage is connected to a floating diffusion (FD) layer 3 which constitutes a charge detection section of the output circuit device.

Signal charge is transferred to the floating diffusion layer 3 from a horizontal transfer register (not shown) of the CCD solid-state imaging element. The floating diffusion layer 3 is reset after each predetermined period by a reset switch 4.

In order to raise the voltage conversion capacity of signal charge of the output circuit device of the construction described above, the parasitic capacitance of the charge detection section should be reduced as low as possible, and also the driving side MOS transistor $Q_{1D}$ of the first stage of the source follower circuit 1 of the output circuit device which receives signal charge first makes an object for such reduction of the parasitic capacitance.

To this end, the area of the gate of the driving side MOS transistor $Q_{1D}$ of the first stage of the source follower circuit 1 is reduced so as to minimize the parasitic capacitance sufficiently, and in order to reduce the 1/f noise which relies upon the area of the gate, an oxide film below the gate is formed as a thinner film.

Figure 2:
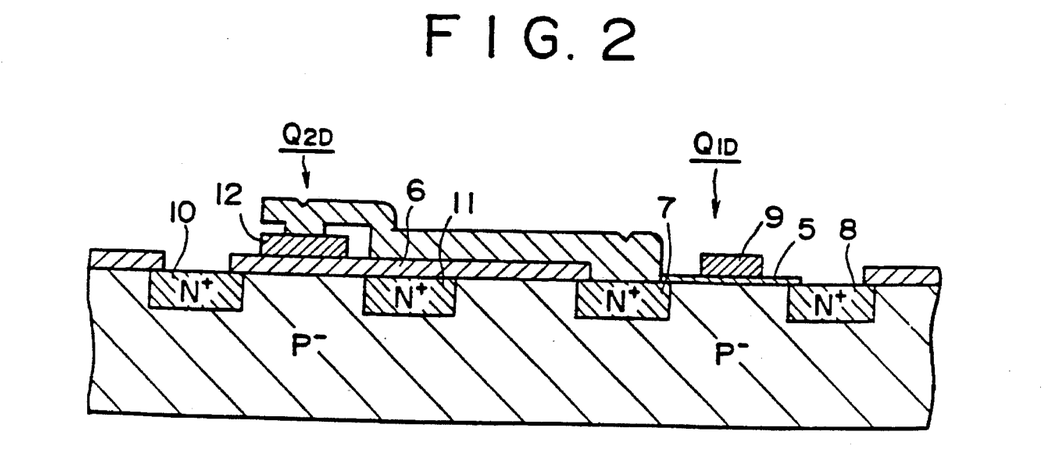
FIG. 2 is a schematic sectional view of drive MOS transistors of first and second stage source followers in the output circuit device of FIG. 1.

FIG. 2 shows a sectional view of the driving side MOS transistors $Q_{1D}$ and $Q_{2D}$ of the output circuit device shown in FIG. 1. Referring to FIG. 2, the driving side MOS transistor $Q_{1D}$ is formed from a gate oxide film 5, a source region 7, a drain region 8 and a gate electrode 9, and the driving side MOS transistor $Q_{2D}$ is formed from a gate electrode 6, a source region 10, a drain region 11 and a gate electrode 12.

The last or third stage of the source follower circuit 1 is constituted from MOS transistors of a size which can supply sufficient current to drive a buffer (not shown) outside the CCD solid-state imaging element.

Meanwhile, in the second stage of the source follower circuit 1, the size of MOS transistors is optimized so that the second stage can be driven sufficiently by the first stage of the source follower circuit 1 and can drive the last stage of the source follower circuit 1 sufficiently and the entire output circuit device has a satisfactory frequency characteristic.

It is to be noted that formation of the entire output circuit device from thin films will reduce the static voltage resisting property of the output circuit device, which may result in destruction of the circuit, and accordingly is not suitable for products by mass production.

Even where the gate oxide film 5 of the driving side MOS transistor $Q_{1D}$ of the first stage of the source follower circuit 1 is formed from a thinner film than oxide films of the other MOS transistors $Q_{1L}$, $Q_{2D}$, $Q_{2L}$, $Q_{3D}$ and $Q_{3L}$ in the same circuit as described above, the static voltage resisting property of the MOS transistor $Q_{1D}$ is not deteriorated by connecting a protective resistor R, as shown in FIG. 1, to the driving side MOS transistor $Q_{1D}$ of the first stage of the source follower circuit 1 which receives signal charge first because the current to flow through the MOS transistor $Q_{1D}$ is low. Further, by reducing the area of the gate, the 1/f noise can be reduced while the voltage conversion capacity of signal charge of a weak signal is maintained at a high level.

Figure 3:
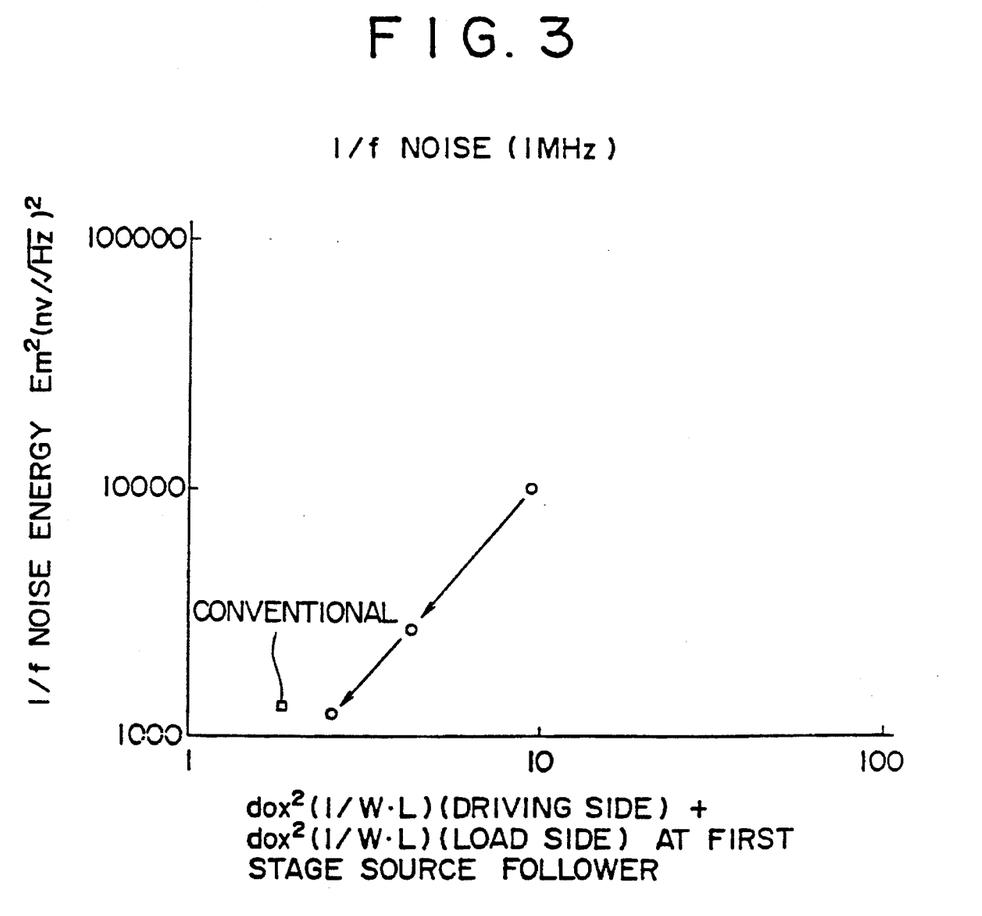
FIG. 3 is a characteristic diagram showing a result of an experiment conducted with the output circuit device of FIG. 1.

FIG. 3 shows a result of an experiment conducted with output circuit devices manufactured in accordance with the construction of the output circuit device described above with reference to FIGS. 1 and 2. More particularly, FIG. 3 is a characteristic diagram which illustrates what variation the noise energy presents with respect to variations of the area of the gate and the thickness of the gage oxide film of the first stage of the source follower circuit.

As apparently seen from the result of the experiment, as the thickness of the gate oxide film decreases, the 1/f noise decreases with the same gate area. In other words, even if the size of MOS transistors is reduced in order to raise the voltage conversion capacity of signal charge, the 1/f noise can be reduced to or lower than that of conventional output circuit devices by reducing the thickness of the gate oxide film.

In particular, referring to FIG. 2 which shows the sectional structure of the driving side MOS transistors $Q_{1D}$ and $Q_{2D}$ of the first and second stages of the source follower circuit 1, the gate oxide film 5 of the driving side MOS transistor $Q_{1D}$ of the first stage of the source follower circuit 1 is formed as a thin film of a thickness equal to approximately two thirds to one third of the thickness of the gate oxide film 6 of the driving side MOS transistor $Q_{2D}$ of the second stage of the source follower circuit 1.

While the driving side MOS transistor $Q_{1D}$ of the first stage of the source follower circuit 1 is shown in contrast to the driving side MOS transistor $Q_{2D}$ of the second stage of the source follower circuit 1 in FIG. 2, the gate oxide films of the first stage load side MOS transistor $Q_{1L}$ and the MOS transistor $Q_{2D}$, $Q_{2L}$, $Q_{3D}$ and $Q_{3L}$ of the second and third stages of the source follower circuit 1 are formed with a same film thickness, and the gate oxide film of the first stage driving side MOS transistor $Q_{1D}$ is formed with a smaller thickness than that of the gate oxide films.

For example, the conversion efficiency was raised and the 1/f noise was reduced successfully by adopting, for the first stage driving side MOS transistor, a MOS transistor having the gate width (W) of 3 μm and the gate oxide film thickness of 50 nm comparing with a floating diffusion amplifier wherein the first stage driving side MOS transistor has the gate width (W) of 10 μm and the gate oxide film thickness of 100 nm.

The formation of the gate oxide film 5 of the driving side MOS transistor $Q_{1D}$ of the first stage of the source follower circuit 1 with a smaller thickness can be realized by first forming gate oxide films of an equal film thickness for all of the MOS transistors $Q_{1D}$, $Q_{1L}$, $Q_{2D}$, $Q_{2L}$, $Q_{3D}$ and $Q_{3L}$ constituting the source follower circuit 1 and then reducing the thickness only of the gate oxide film 5 of the first stage driving side MOS transistor $Q_{1D}$ to ⅔ or ⅓, for example, by dry etching.

Here, where the area of the gate of a MOS transistor is represented by W·L and the thickness of the gate oxide film of the MOS transistor is represented by dox, the noise energy $E_{nf}^2$ of the 1/f noise which relies upon them is given by the following expression:

$$E_{nf}^2 \propto (1/W \cdot L^3 \cdot dox^2, K, (1/f^m))$$

where K is a constant which depends upon an interface level of $Si/SiO_2$, f is a frequency, and m is a value ranging from 1 to 0.8.

As described so far, according to the present embodiment, since an output circuit device for detecting signal charge transferred thereto from a charge transfer section of a charge transfer element such as a solid-state imaging element and converting the signal charge into a signal voltage is constructed such that a gate oxide film of a MOS transistor which receives the signal charge is formed as a thinner film than gate oxide films of the other MOS transistors in the same circuit, the 1/f noise can be reduced because the 1/f noise which is produced from the output circuit device increases in proportion to the square of the thickness of the gate oxide film of the MOS transistor, and consequently, while the voltage conversion capacity of low signal charge can be maintained at a high level by reducing the area of the gate of the MOS transistor, the picture quality and the sensitivity characteristic at a low illuminance can be enhanced by reduction of the 1/n noise.

Figure 4:
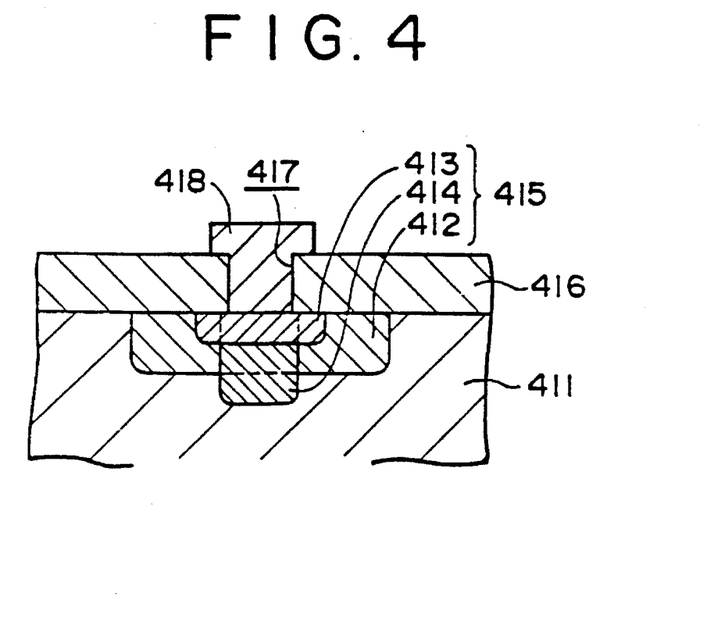
FIG. 4 is a partial schematic sectional view of another output circuit device for a charge transfer element showing a second preferred embodiment of the present invention.

Subsequently, another output circuit device for a charge transfer element according to a second preferred embodiment of the present invention will be described with reference to FIG. 4 which schematically shows a signal charge accumulation region. In the second embodiment, the present invention is applied to the signal charge accumulation region of an output circuit device for a charge transfer element.

A diffusion layer 415 is formed on a p-type silicon semiconductor body 411 formed on an n-type semiconductor substrate (not shown). The diffusion layer 415 is constituted from a first diffusion layer 412, a second diffusion layer 413 and a third diffusion layer 414. The first diffusion layer 412 is formed by diffusing phosphorous of a low concentration into the silicon semiconductor body 411 and has a dose amount of, for example, approximately $1 \times 10^{12}$ cm$^{-2}$.

The second diffusion layer 413 is formed at part of the first diffusion layer 412 by diffusing arsenic or antimony of a high concentration having a dose amount of, for example, approximately $1 \times 10^{16}$ cm$^{-2}$. Further, the third diffusion layer 414 is formed within the range of the second diffusion layer 413 in the surface of the semiconductor body 411 deeper than the first diffusion layer 412 by diffusing phosphorous of a high concentration having a dose amount of, for example, approximately $1 \times 10^{16}$ cm$^{-2}$.

An insulation film 416 is formed on the semiconductor body 411. A contact hole 417 is formed in the insulation film 416 on the diffusion layer 415. A wiring line 418 extends through the contact hole 417 and is connected to the diffusion layers 415.

In the structure of the junction portion described above, since the first diffusion layer 412 in which phosphorous of a low concentration is diffused is formed on the semiconductor body 411, the depth of the diffusion layers 415 does not become excessively great.

Further, since the second diffusion layer 413 in which arsenic or antimony of a high concentration is diffused is formed on the upper face of the first diffusion layer 412, the contact resistance at a connection to the wiring line 418 is reduced.

Furthermore, since the third diffusion layer 414 in which phosphorous of a high concentration is diffused is formed in a deeper condition than the first diffusion layer 412, the resisting property against an aluminum spike which may be produced where the wiring line 418 is formed from an alloy containing aluminum is enhanced, and no junction leak is produced any more.

A process of manufacturing the output circuit device will be described with reference to FIGS. 5(A) to 5(D).

Figure 5A:
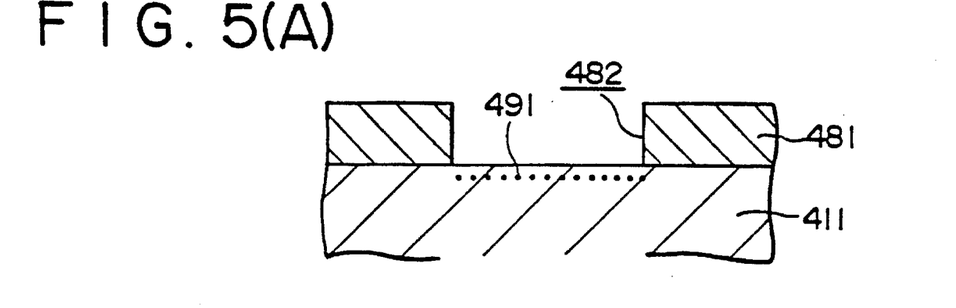
FIGS. 5(A) to 5(D) are schematic sectional views showing successive steps of a procedure of manufacturing the output device shown in FIG. 4.

At a first step, an ion implantation mask 418 is formed on a semiconductor body 411 as shown in FIG. 5(A) by ordinary photolithography. An opening 482 for introducing an impurity therethrough is formed in the ion implantation mask 481.

Then, phosphorous 491 of a low concentration is introduced into the semiconductor body 411 by ion implantation. The dose amount then is set, for example, to $1 \times 10^{12}$ cm$^{-2}$.

Thereafter, the ion implantation mask 418 is removed by, for example, ushering, wet etching or a like technique.

Figure 5B:
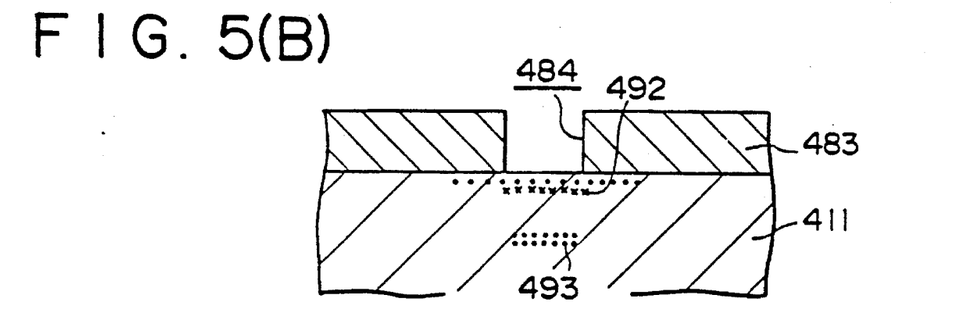

Subsequently, a second step illustrated in FIG. 5(B) is performed. At the second step, an ion implantation mask 483 is formed by ordinary photolithography. An opening 484 is formed in the ion implantation mask 483 in a region corresponding to but smaller than the location of the opening 482.

Then, arsenic (or antimony) 492 of a high concentration is introduced into a shallow location of the upper face of the semiconductor body 411 by ion implantation. The dose amount then is set, for example, to $1 \times 10^{16}$ cm$^{-2}$. Further, using the same ion implantation mask 483, phosphorous 493 of a high concentration is introduced into the semiconductor body 411 in a deeper condition than the formerly introduced phosphorous 491 of a low concentration. The dose amount then is set to, for example, $1 \times 10^{16}$ cm$^{-2}$. It is to be noted that, while ions are implanted, in the ion implantation described just above, using the same ion implantation mask 483, it is otherwise possible to perform such ion implantation, for example, forming an ion implantation mask for each ion implantation.

Thereafter, the ion implantation mask 483 is removed by, for example, ushering, wet etching or a like processing.

Figure 5C:
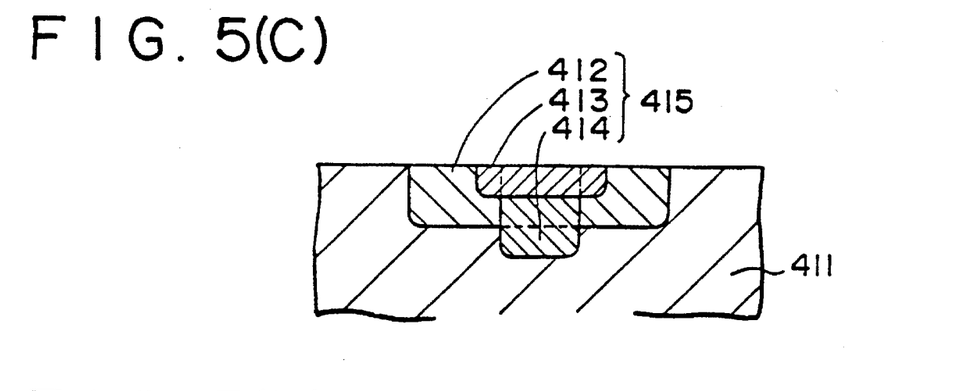

Subsequently, annealing is performed to diffuse the thus introduced impurities into the semiconductor body 411 as shown in FIG. 5(C) to activate the semiconductor body 411. Then, a first diffusion layer 412 in which the phosphorous 491 of a low concentration is diffused is formed in the semiconductor body 411. Further, a second diffusion layer 413 in which arsenic (or antimony) 492 of a concentration higher than that of the first diffusion layer 412 is formed on the first diffusion layer 412. Further, a third diffusion layer 414 in which phosphorous 93 of a concentration higher than that of the first diffusion layer 412 is formed within the range of the second diffusion layer 413 in the surface of the semiconductor body 411 in a deeper condition than the first diffusion layer 412.

Diffusion layers 415 including the first, second and third diffusion layers 412. 413 and 414 are formed in this manner.

Figure 5D:
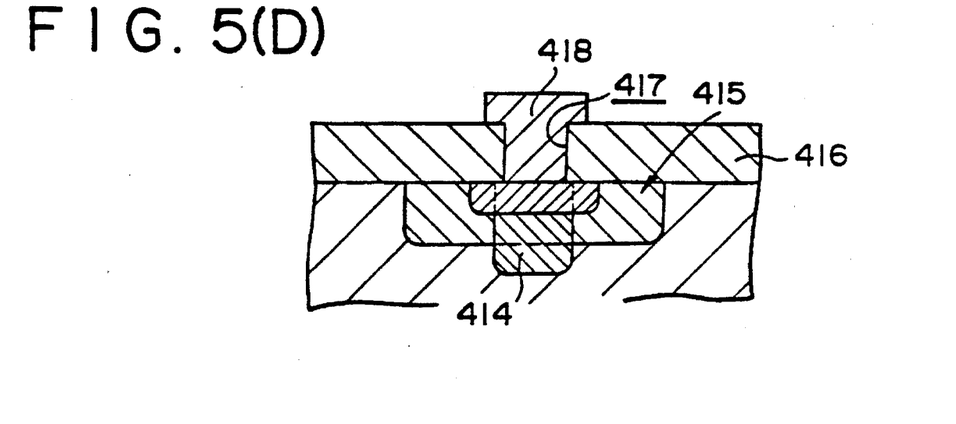

Thereafter, an insulation film 416 is formed on the upper face of the semiconductor body 411 as shown in FIG. 5(D) by an ordinary film formation technique such as, for example, a CVD (chemical vapor deposition) method. Then, a contact hole 417 is formed in the insulation film 416 on the third diffusion layer 414 of the diffusion layers 415 by ordinary photolithography and etching. Subsequently, a film (not shown) for formation of a wiring line is formed by ordinary wiring line formation technique, and then a wiring line 418 connected to the diffusion layer 415 through the contact hole 417 is formed by photolithography and etching.

In the manufacturing method of the junction structure described above, the difference in introduction depth and the difference in diffusion coefficient between the impurities introduced into the semiconductor body 411 by, for example, ion implantation are utilized. In particular, after the phosphorous 491 of a low concentration to form the first diffusion layer 412 is introduced, the arsenic (or antimony) 492, which has a higher concentration than the phosphorous 491, to form the second diffusion layer 413 is introduced, and then the phosphorous 493 of a high concentration to form the third diffusion layer 414 deeper than the first diffusion layer 412 is introduced. In this manner, the second diffusion layer 413 is formed shallow by introducing arsenic or antimony of a lower diffusion coefficient shallow, and the third diffusion layer 414 is formed deep by introducing phosphorous of a high diffusion coefficient deep.

Figure 6:
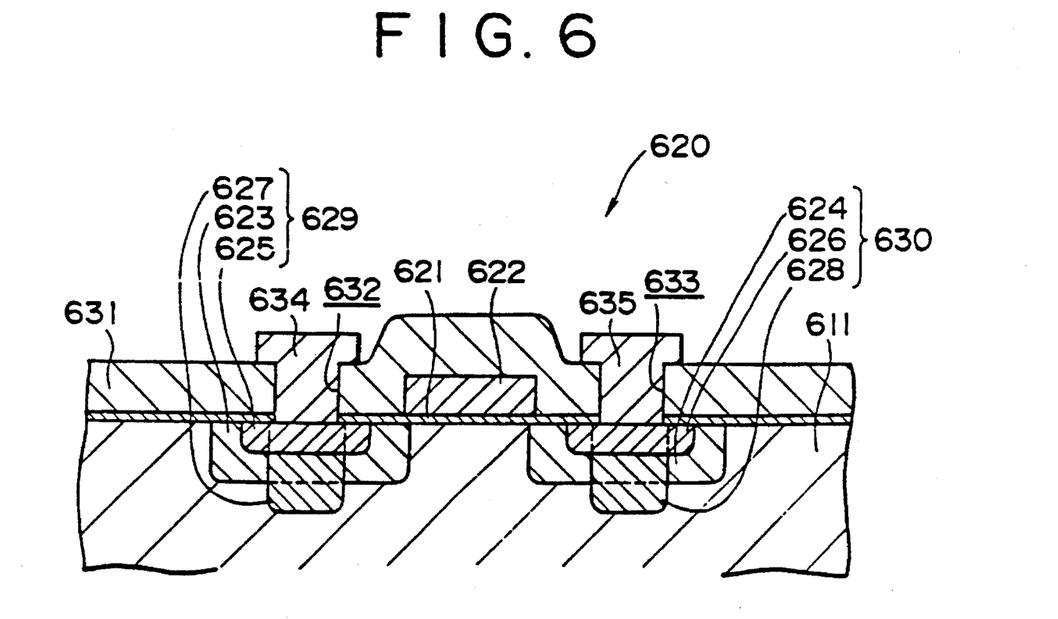
FIG. 6 is a partial schematic sectional view of a further output circuit device for a charge transfer element showing a third preferred embodiment of the present invention.

Subsequently, a further output circuit device for a charge transfer element according to a third embodiment of the present invention will be described with reference to FIG. 6. In the present embodiment, the present invention is applied to a source/drain region of a MOS transistor of a source follower of an output Circuit device for a charge transfer element. FIG. 6 schematically shows a source/drain region of a MOS transistor.

A gate electrode 622 is formed on a semiconductor body 611 with a gate insulation film 621 interposed therebetween. A pair of first diffusion layers 623 and 624 are formed on the semiconductor body 611 on the opposite sides of the gate electrode 622 by diffusing phosphorous of a low concentration. The dose amount of the first diffusion layers 623 and 624 is set to, for example, approximately $1\times10^{12}$ cm$^{-2}$.

A pair of second diffusion electrodes 625 and 626 are formed at portions of the upper faces of the first diffusion layers 623 and 624, respectively, by diffusing arsenic or antimony by the dose amount, for example, of approximately $1\times10^{16}$ cm$^{-2}$. Further, a pair of third diffusion layers 627 and 628 are formed in the ranges of the second diffusion layers 625 and 626 on the surface of the semiconductor body 611 in a deeper condition than the first diffusion layers 623 and 624, respectively, by diffusing phosphorous of a high concentration by the dose amount of, for example, $1\times10^{16}$ cm$^{-2}$.

In this manner, a diffusion layer 629 is constituted from the first, second and third diffusion layers 623, 625 and 627, and another diffusion layer 630 is formed from the first, second and third diffusion layers 624, 626 and 628.

The diffusion layers 629 and 730 function as source-drain regions of a MOS transistor 620.

The MOS transistor 620 is constructed in such a manner as described above.

An insulation film 631 is formed on the semiconductor body 611 in such a manner as to cover over the gate electrode 622. A pair of contact holes 632 and 633 are formed in the insulation film 631 above the diffusion layers 629 and 630, respectively. Further, a pair of wiring lines 634 and 635 are formed to extend through the contact holes 632 and 633 and connected to the diffusion layers 629 and 630, respectively.

With the junction structure of the MOS transistor 620 described above, since the first diffusion layers 623 and 624 in which phosphorous of a low concentration is diffused are formed on the semiconductor body 611, the depth of the diffusion layers 629 and 630 does not become excessively great. Further, by forming the first diffusion layers 623 and 624 into depletion layers, the capacitance of the diffusion layers 629 and 630 is prevented from becoming high.

Further, since the second diffusion layers 625 and 626 in which arsenic or antimony of a high concentration is diffused are formed on the first diffusion layers 623 and 624, respectively, the contact resistances at connections to the wiring lines 634 and 635 are reduced.

Furthermore, since the third diffusion layers 627 and 628 in which phosphorous of a high concentration are formed in a deeper condition than the first diffusion layers 623 and 624, where the wiring lines 634 and 635 are formed from an alloy containing aluminum, even if an aluminum spike is produced, it becomes less liable for a junction leak to occur.

The source-drain regions of the MOS transistor in the present embodiment can be manufactured similarly to those in the second embodiment described hereinabove. In particular, a gate insulation film 621 is first formed on the upper face of a semiconductor body 611, and then a gate electrode 622 is formed on the upper face of the gate insulation film 621. Thereafter, a diffusion layer 629 including first, second and third diffusion layers 623, 625 and 627 having different impurity concentrations and different impurity introduction depths is formed similarly to the manufacturing method described above. Further, another diffusion layer 630 including first, second and third diffusion layers 624, 626 and 628 is formed. In this instance, an ion implantation mask (not shown) which is used to form the first diffusion layers 623 and 624 is provided in such a condition as to cover over the gate electrode 622. By forming the ion implantation mask in this manner, the ranges in which the first diffusion layers 623 and 624 to make source-drain regions of the MOS transistor are positioned below the gate electrode 622 is reduced.

While the present invention is applied to the MOS transistor of a source follow circuit in the present embodiment, it can be applied also to source-drain regions of a reset transistor of an output circuit device for a charge transfer element.

Figure 7:
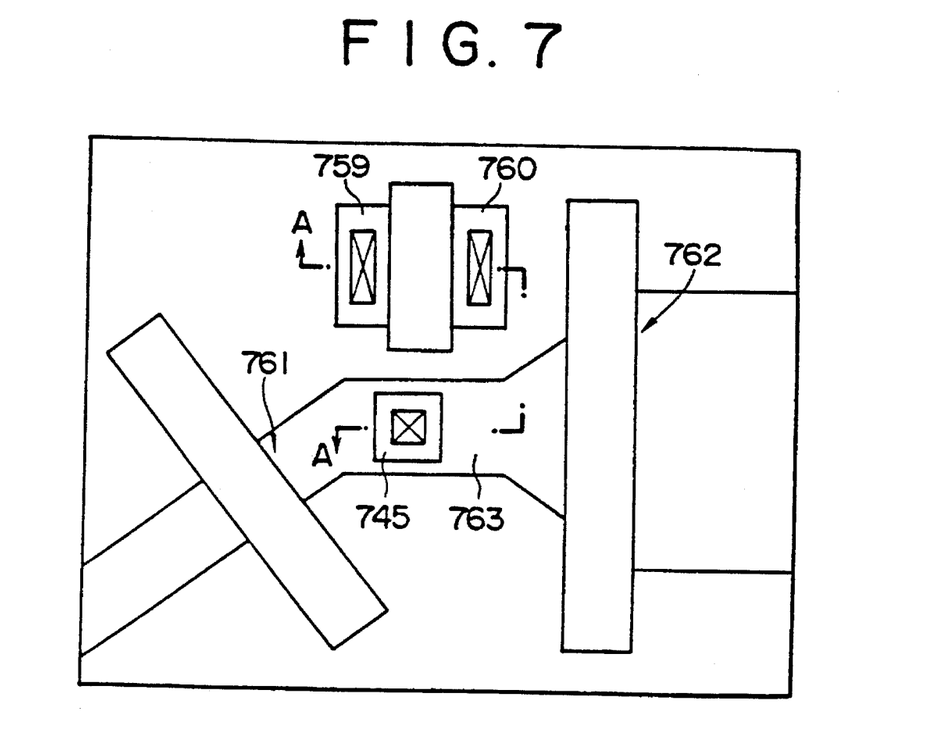
FIG. 7 is a schematic plan view of a still further output circuit device for a charge transfer element showing a fourth preferred embodiment of the present invention.
Figure 8:
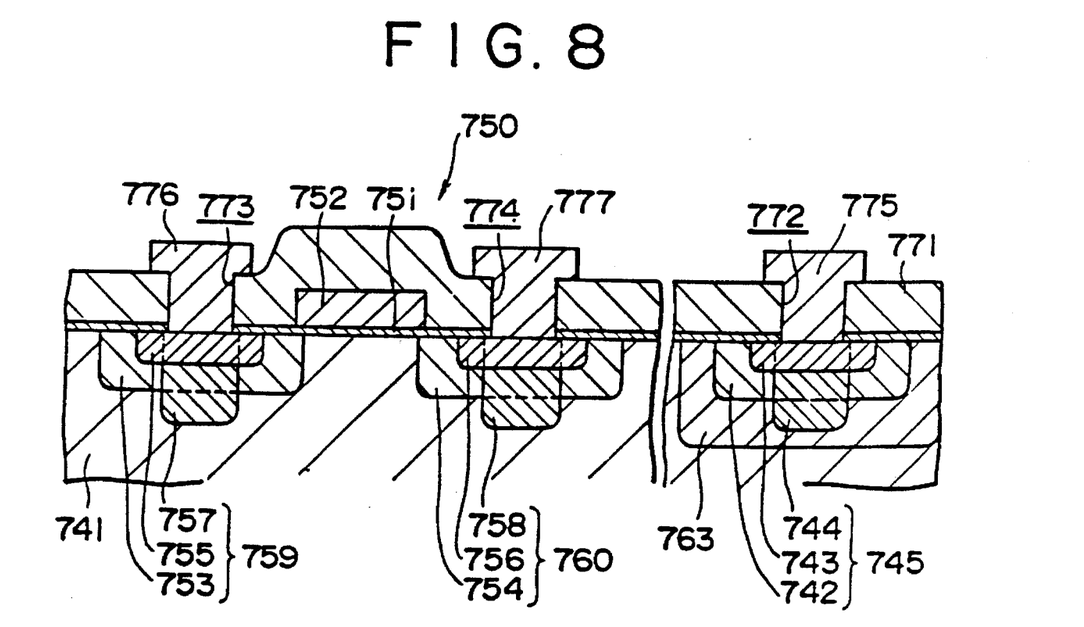
FIG. 8 is a sectional view taken along line A—A of FIG. 7.

FIGS. 7 and 8 show an output circuit device for a charge transfer element according to a fourth preferred embodiment of the present invention. In the present embodiment, the present invention is applied to a diffusion layer of an output circuit device for a solid-state imaging apparatus, that is, a floating diffusion layer for accumulating signal charge, and a source-drain region of a MOS transistor of a source follower.

Referring to FIGS. 7 and 8, a reset transistor 761 and a horizontal output transistor 762 are provided in a semiconductor body 741. The resetting transistor 761 and the horizontal output transistor 762 commonly include a low concentration diffusion layer 763 formed on the upper face of the semiconductor body 741.

A first diffusion layer 742 in which phosphorous of a low concentration is diffused is formed on the upper face of the low concentration diffusion layer 763. The first diffusion layer 742 has a dose amount of, for example, approximately $1\times10^{12}$ cm$^{-2}$.

A second diffusion layer 743 in which arsenic or antimony of a high concentration having a dose amount of, for example, approximately $1\times10^{16}$ cm$^{-2}$ is diffused is formed at a portion of the upper face of the first diffusion layer 742. Further, a third diffusion layer 744 in which phosphorous of a high concentration having a dose amount of, for example, approximately $1\times10^{16}$ cm$^{-2}$ is formed within the region of the second diffusion layer 743 on the surface of the semiconductor body 741 in a deeper condition than the first diffusion layer 742.

A diffusion layer 745 is formed from the first, second and third diffusion layers 742, 743 and 744 in this manner.

Accordingly, the diffusion layer 745 is formed in a floating condition with respect to the semiconductor body 741.

A gate electrode 752 is formed on the semiconductor body 741 with a gate insulation film 751 interposed therebetween.

Further, a pair of first diffusion layers 753 and 754 in which phosphorous of a low concentration is diffused are formed on the upper face of the semiconductor body 741 on the opposite sides of the gate electrode 752. The first diffusion layers 753 and 754 have a dose amount of, for example, approximately $1\times10^{12}$ cm$^{-2}$.

A pair of second diffusion layers 755 and 756 in which arsenic or antimony of a high concentration having a dose amount of, for example, approximately $1\times10^{16}$ cm$^{-2}$ is diffused are formed at portions of the upper faces of the first diffusion layers 753 and 754, respectively. Further, a pair of third diffusion layers 757 and 758 in which phosphorous of a high concentration having a dose amount of, for example, approximately $1\times10^{16}$ cm$^{-2}$ is diffused are formed in the ranges of the second diffusion layers 755 and 756 on the surface of the semiconductor body 741 in a deeper condition than the first diffusion layers 753 and 754, respectively.

A diffusion layer 759 is formed from the first, second and third diffusion layers 753, 755 and 757 and another diffusion layer 560 is formed from the first, second and third diffusion layers 754, 756 and 758 in this manner.

An output transistor 750 wherein the diffusion layers 759 and 760 serve as source-drain regions is constructed in this manner.

Further, an insulation film 771 is formed on the semiconductor body 741 in such a manner as to cover over the diffusion layer 745, the output transistor 750 and so forth. Contact holes 772, 773 and 774 are formed in the insulation film 71 above the diffusion layer 745 and the diffusion layers 759 and 760 of the output transistor 750, respectively. Wiring lines 775, 776 and 777 are formed to extend through the contact holes 772, 773 and 774 and connected to the diffusion layers 745, 759 and 760, respectively.

In the solid-state imaging apparatus in which the junction structure described above is employed, the wiring lines 775, 776 and 777 can be formed from aluminum so that they may be applied as light intercepting films on transfer electrodes. Further, similar effects to those achieved with the second and third embodiments described above can be achieved.

The output circuit device of the present embodiment can be manufactured by a process illustrated in FIGS. 9(A) to 9(D).

Figure 9A:
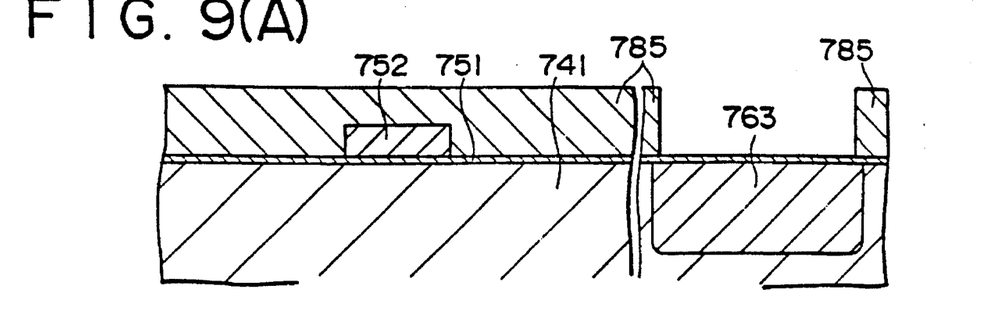
FIGS. 9(A) to 9(D) are schematic sectional views showing successive steps of a procedure of manufacturing the output circuit device of FIG. 7.

First, a gate insulation film 751 for an output transistor 750 is formed on the upper face of a semiconductor body 741, and then a gate electrode 752 for the output transistor 750 is formed on the upper face of the gate insulation film 751 as shown in FIG. 9(A). Thereupon, for example, gate insulation films (not shown) and/or gate electrodes (not shown) for reset transistors (not shown) and/or horizontal output transistors (not shown) are formed as other transistors.

Subsequently, an ion implantation mask 785 is formed at a predetermined position by ordinary photolithography. Then, a diffusion layer 763 for a floating diffusion region is formed by ion implantation. Thereafter, the ion implantation mask 785 having been used in the ion implantation is removed.

Figure 9B:
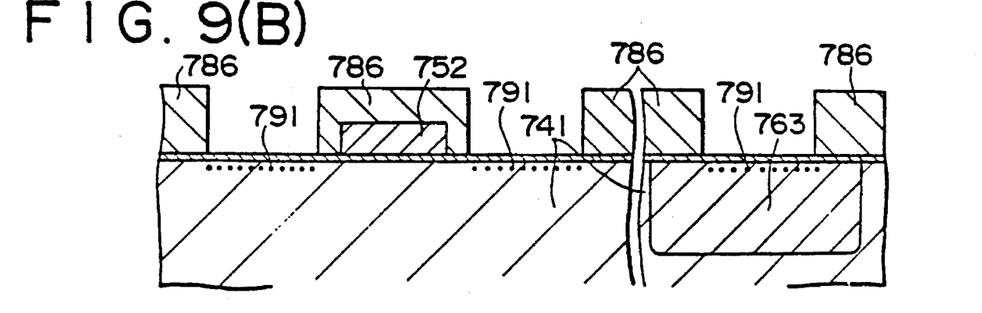

Then, another ion implantation mask 786 is formed at a predetermined position as shown in FIG. 9(B) by ordinary photolithography in accordance with the manufacturing method for the junction structure described above. The ion implantation mask 786 is formed in such a manner as to cover over the gate electrode 752. Subsequently, phosphorous 791 of a low concentration is introduced into a predetermined position of the low concentration diffusion layer 763, which makes a region in which the first diffusion layer 742 is to be formed, by ion implantation. Further, phosphorous 791 of a low concentration is introduced into predetermined positions of the semiconductor body 741, which make regions in which the first diffusion layers 753 and 754 are to be formed. In this instance, it is also possible to employ the gate electrode 752 for a portion of the ion implantation mask 788. In particular, by using the gate electrode 752 as an ion implantation mask, phosphorous 791 of a low concentration is introduced in a self-aligning condition into regions of the semiconductor body 741 on the opposite sides of the gate electrode 752 in which the first diffusion layers 753 and 754, which serve as source-drain regions, are to be formed.

Thereafter, the ion implantation mask 788 is removed.

Figure 9C:
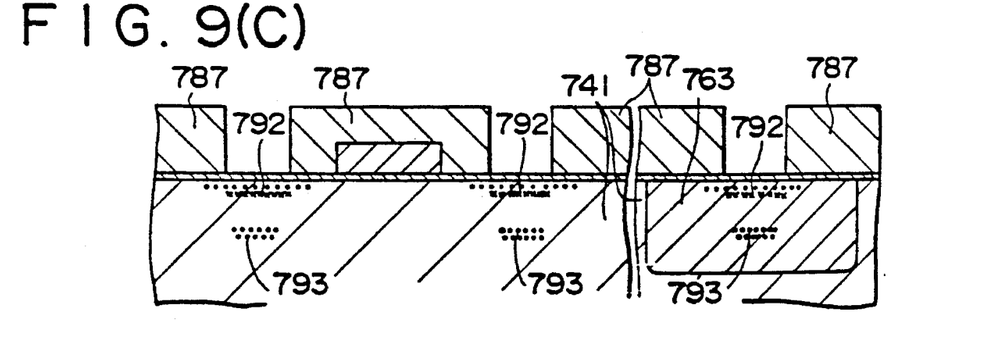

Subsequently, a further ion implantation mask 787 is formed at a predetermined position as shown in FIG. 9(C) by ordinary photolithography. Then, arsenic (or antimony) 792 of a high concentration is introduced into predetermined positions of the semiconductor body 741 which make regions in which the second diffusion layers 755, 758 and 743 are to be formed and a predetermined position of the low concentration diffusion region 783 by ion implantation. Further, phosphorous 793 of a high concentration is introduced into predetermined positions of the semiconductor body 741 which make regions in which the third diffusion layers 757, 758 and 744 are to be formed and a predetermined position of the low concentration diffusion layer 763.

Thereafter, the ion implantation mask 787 is removed.

Figure 9D:
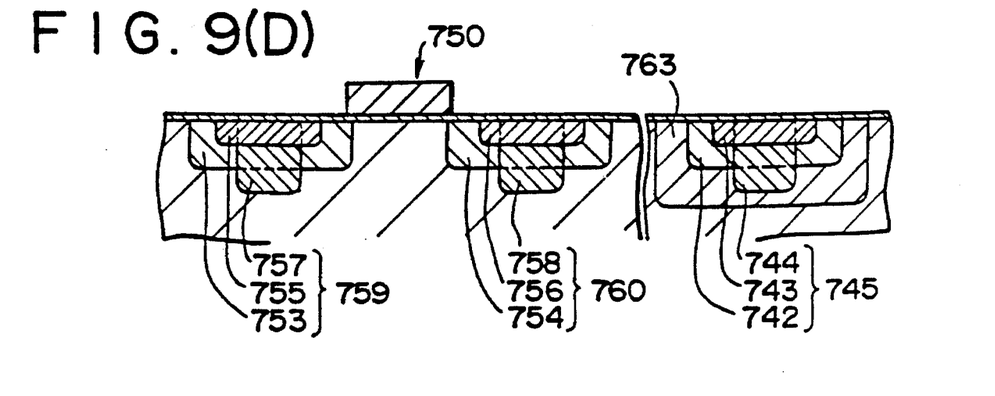

Then, annealing is performed to form first diffusion layers 753 and 754, in which phosphorous 791 of a low concentration is diffused, on the upper face of the semiconductor body 741 as shown in FIG. 9(D). Further, second diffusion layers 755 and 756 in which arsenic (or antimony) 792 of a high concentration is diffused are formed at portions of the upper faces of the first diffusion layers 754 and 755, respectively. Thereafter, third diffusion layers 757 and 758 in which phosphorous 793 of a high concentration is diffused in a deeper condition than the first diffusion layers 753 and 754 are formed.

A diffusion layer 759 constituted from the first, second and third diffusion layers 753, 755 and 757 is formed and another diffusion layer 760 constituted from the first, second and third diffusion layers 754, 756 and 758 is formed in this manner.

Simultaneously, a first diffusion layer 754 in which phosphorous 791 of a low concentration is diffused is formed at a portion of the source-drain diffusion layer 763. Further, a second diffusion layer 743 in which arsenic (or antimony) 792 of a high concentration is diffused is formed at a portion of the upper face of the first diffusion layer 742. Furthermore, a third diffusion layer 744 in which phosphorous 793 of a high concentration is diffused in a deeper condition than the first diffusion layer 742 is formed.

A diffusion layer 745 constituted from the first, second and third diffusion layers 742, 743 and 744 is formed in this manner.

The diffusion layers 759 and 760 function as source-drain regions of the output transistor 750. Meanwhile, the diffusion layer 745 functions as a floating diffusion layer.

The construction of the junction described above can be applied not only to a junction of an output circuit device for a charge transfer element described above in connection with the present embodiment but also to a diffusion layer for a junction capacitance or a source-drain region of a MOS transistor.

Having now fully described the invention, it will be apparent to one of ordinary skill in the art that many changes and modifications can be made thereto without departing from the spirit and scope of the invention as set forth herein.

What is claimed is:

1. A method of forming a MOSFET output circuit device for a charge transfer element, comprising the steps of:

providing a semiconductor body of a first conductivity type;

forming a first diffusion region by diffusing into the semiconductor body a low concentration of a first impurity of a second conductivity type opposite to that of said semiconductor body and having a high diffusion coefficient;

forming a second diffusion region by diffusing into an upper surface portion of the first diffusion region a high concentration of a second impurity of said second conductivity type having a low diffusion coefficient, said second diffusion region having a depth that does not extend beneath a depth of said first diffusion region;

forming a third diffusion region by diffusing into the first and second diffusion regions a high concentration of a third impurity of said second conductivity type having a high diffusion coefficient, such that the third diffusion region extends from a surface of said semiconductor body through said first and second diffusion regions to beneath said first diffusion region; and forming a wiring line on the semiconductor body such that the first, second and third diffusion regions lie beneath the wiring line, wherein the concentrations of the second and third impurities in the second and third diffusion regions, respectively, are higher than the concentration of the first impurity and the first diffusion region, and wherein the first, second and third diffusion regions serve as a source or drain region of the MOSFET output circuit device.

2. The method of claim 1, wherein the first and third impurities are phosphorous.

3. The method of claim 1, wherein the second impurity having a low diffusion coefficient is selected from the group consisting of arsenic and antimony.

4. The method of claim 1, wherein the low concentration of the first impurity having a high diffusion coefficient in the first diffusion region has a dose of about $10^{12}$ cm$^{-2}$.

5. The method of claim 1, wherein the high concentration of the second impurity having a low diffusion coefficient in the second diffusion region has a dose of about $10^{16}$ cm$^{-2}$.

6. The method of claim 1, wherein the high concentration of the third impurity having a high diffusion coefficient in the third diffusion region has a dose of about $10^{16}$ cm$^{-2}$.

7. The method of claim 1, wherein the low concentration of the first impurity having a high diffusion coefficient in the first diffusion region has a dose of about $10^{12}$ cm$^{-2}$;

the high concentration of the second impurity having a low diffusion coefficient in the second diffusion region has a dose of about $10^{16}$ cm$^{-2}$; and the high concentration of a third impurity of a high diffusion coefficient has a dose of about $10^{16}$ cm$^{-2}$.

8. The method of claim 1, wherein the semiconductor body is a P-type semiconductor body.

9. The method of claim 1, wherein the first and third impurities of the first and third diffusion regions are phosphorous and the second impurity in the second diffusion region is selected from the group consisting of arsenic and antimony.

10. The method of claim 9, wherein the low concentration of the first impurity having a high diffusion coefficient in the first diffusion region has a dose of about $10^{12}$ cm$^{-2}$.

11. The method of claim 9, wherein the high concentration of the second impurity having a low diffusion coefficient in the second diffusion region has a dose of about $10^{16}$ cm$^{-2}$.

12. The method of claim 9, wherein the high concentration of an impurity of a high diffusion coefficient has a dose of about $10^{16}$ cm$^{-2}$.

13. The method of claim 9, wherein the concentration of phosphorous, in the first diffusion region has a dose of about $10^{12}$ cm$^{-2}$, the concentration of phosphorous in the third diffusion region has a dose of about $10^{16}$ cm$^{-2}$ and the concentration of arsenic or antimony in the second diffusion region has a dose of about $10^{16}$ cm$^{-2}$.

14. The method of claim 9, wherein the semiconductor body is a P-type semiconductor body.

* * * * *